US007286696B2

(12) United States Patent
Erickson et al.

(10) Patent No.: US 7,286,696 B2
(45) Date of Patent: Oct. 23, 2007

(54) METHOD AND APPARATUS FOR UTILIZING REPRESENTATIONAL IMAGES IN COMMERCIAL AND OTHER ACTIVITIES

(76) Inventors: Ronald R. Erickson, 215 Berkeley Pl., Brooklyn, NY (US) 11217; Eliezer D. Sandler, 1173 E. 29th St., Brooklyn, NY (US) 11210; Joel N. Bock, 1321 Hastings St., Teaneck, NJ (US) 07666

(*) Notice: Subject to any disclaimer, the term of this patent is extended or adjusted under 35 U.S.C. 154(b) by 973 days.

(21) Appl. No.: 10/008,085

(22) Filed: Oct. 18, 2001

(65) Prior Publication Data

US 2002/0122581 A1 Sep. 5, 2002

Related U.S. Application Data

(60) Provisional application No. 60/241,304, filed on Oct. 18, 2000.

(51) Int. Cl.
 *G06K 9/00* (2006.01)
(52) U.S. Cl. .................................... 382/141
(58) Field of Classification Search ........ 382/141–151, 382/154, 218, 284, 311; 345/632; 348/92, 348/95
 See application file for complete search history.

(56) References Cited

U.S. PATENT DOCUMENTS

| | | | | |
|---|---|---|---|---|
| 4,663,658 A | * | 5/1987 | Lanne et al. | 348/95 |
| 5,134,664 A | * | 7/1992 | Clough et al. | 382/145 |
| 5,428,444 A | * | 6/1995 | Haddock et al. | 356/458 |
| 5,530,652 A | * | 6/1996 | Croyle et al. | 700/130 |
| 5,687,305 A | * | 11/1997 | Graham et al. | 345/632 |
| 5,748,347 A | | 5/1998 | Erickson et al. | 359/23 |
| 5,790,687 A | * | 8/1998 | McLaughlin et al. | 382/111 |
| 5,803,579 A | * | 9/1998 | Turnbull et al. | 362/516 |
| 6,367,088 B1 | * | 4/2002 | Bergemann | 2/244 |
| 6,658,312 B1 | * | 12/2003 | Hagiyama | 700/95 |
| 6,856,859 B1 | * | 2/2005 | Bett et al. | 700/222 |

OTHER PUBLICATIONS

Ko, K., Erickson, R., Webster, J., "Holography and the Virtual Patient: the Holographic Medical Image," SPIE, vol. 2866, Feb. 1996, pp. 333-338.
Erickson, R., "Holographic Medical Imaging: The Laser as a Visual Scalpel—Issues and Observations on 3-D Display," IEEE Journal of Selected Topics in Quantum Electronics, vol. 2, No. 4, Dec. 1996, pp. 976-983.
Ko, K., "Superimposed Holographic Image-Guided Neurosurgery," J. Neurosurg., vol. 88, Apr. 1998, pp. 777-781.

* cited by examiner

*Primary Examiner*—Daniel Mariam

(57) ABSTRACT

In a method and apparatus for performing commercial and other activities using one or more two- or three-dimensional representational images, superimposing a two- or three-dimensional representational image, containing an image of the workpiece in an advanced state of assembly, with a surface or onto the actual workpiece, and utilizing the superimposed representational image to assist in the assembly of the workpiece. One or more two- or three-dimensional representational images are created, e.g., using standard photography, holography or computer imaging, and are placed in a frame integrated within the assembly line of the manufacturing facility. The workpiece is positioned in relation to location of the representational image, such that the representational image may be superimposed onto the workpiece. An assembly operation is then performed using the superimposed representational image as a template.

59 Claims, 7 Drawing Sheets

METHOD AND APPARATUS FOR UTILIZING REPRESENTATIONAL IMAGES IN COMMERCIAL AND OTHER ACTIVITIES

CROSS REFERENCE TO RELATED APPLICATION

This application claims priority to U.S. Provisional Patent Application Ser. No. 60/241,304 filed Oct. 18, 2000.

FIELD OF THE INVENTION

The present invention relates to a method for creating and using representational images, including holographic representational images in various activities, including industrial processes, manufacturing and quality control/quality assurance. According to the present invention, representational images, including holographic representational images, may be used to enhance accurate analysis, facilitate improved assembly, implementation and quality, and reduce error and misinterpretation.

BACKGROUND OF THE INVENTION

Representational images are very useful as a tool for visual guidance during a wide range of activities involved in industry, including, for example, manufacturing, product development, strategic planning, change implementation and verification and quality assurance and control. Representational images may range, for example, from schematic diagrams of electronic circuits or construction blueprints to fabric cutting diagrams, component layout and placement, and images on surfaces.

In the manufacturing sector, with the continual miniaturization and increasing complexity of many types of products and with the concern for cost minimization during the manufacturing process, many companies have converted to automated assembly or robotics to replace their human work force. Other companies have attempted to streamline and optimize the manufacturing process by hiring industrial engineers and/or consultants to restructure their assembly lines. This has led to single task assembly stations and additional employee training to increase efficiency and to reduce costs, errors, worker fatigue and product assembly time. In both automated manufacturing and optimized human assembly lines, however, schematic diagrams or other forms of printed instructions or plans, are necessary to assist in the manufacturing process.

Despite the improvements by manufacturing companies, through the use of automation or assembly line optimization, there remains room for additional improvement and further optimization of the manufacturing process. The present invention provides for further optimization and cost reductions in both the automated and optimized human manufacturing lines through the use of representational images, including holographic representational images.

For example, there are many products that require some hand assembly or hand wiring to complete their manufacture. In these instances, the representational image used during a manual assembly operation is a schematic diagram which guides the operator and which is used to confirm the proper assembly operation for the workpiece. These schematic diagrams must be placed within the visual range of the operator, and are usually posted directly in front of the operator. However, the position of the schematic diagram requires the operator to look away from the object being assembled to ascertain the proper step. After many repetitions of the same operation, operators usually commit the diagram to memory and rely on their memory to ensure the correctness of their activity, or they become familiar with the assembly step and no longer require a visual check of the schematic diagram to confirm proper assembly. However, with long work shifts, occasional distractions, and a variety of other factors, including human error, a certain percentage of the assembly is performed incorrectly. It is only at the next workstation or in the QA/QC test area that the error may be discovered. The workpiece is then either discarded or repaired, both options adding a significant cost to the total manufacturing costs.

In low technology areas, such as the garment industry, mass production of standardized or standard sized goods requires precision in the cutting of patterns. The cutting operations require the physical placement of a paper pattern on the fabric or material and the physical cutting of the fabric or material by hand operation. Many companies have switched to automated cutting machines to increase efficiency, while others have moved the cutting operations overseas to reduce costs. Many types of garments, however, require certain hand operations from cutting to assembly that either cannot be done by machine or if done by hand require extensive operator training or have high levels of operator error.

In other areas such as detailed painting and decal or preprinted material application, the operator must spend time prior to actually performing the painting or application to first outline or mark the areas to be painted or where the materials are to be applied or the various patterns using a picture or detailed layout diagram. Only when the outlining or marking is complete can the operator fill in the outlined areas with the proper colors or apply the materials.

These are just some of the many areas where schematic diagrams or representational images are currently being used, and where improvements are possible and feasible through the use of representational images, including holographic representational images according to the present invention.

SUMMARY OF THE INVENTION

The present invention provides a method for creating and using representational images, including holographic representational images, and an apparatus for using representational images, to increase efficiency, reduce costs, and provide greater amounts of information for a variety of tasks and analysis across many different sectors of the workplace and the home.

The representational images described herein may be used as a Two or Three Dimensional Visual Template (2DVT or 3DVT) type of representational image presented in superimposition with the object to be manufactured. The 2DVT and 3DVT superimpose the visual image of the task specific information onto the workpiece, for example, the workpiece as it will appear on completion of that particular step in the manufacturing process, onto the workpiece from the previous step(s). Additionally, the 3DVT places the visual image in exact register, including depth, with the workpiece. The 2DVT utilizes the superimposed image to capture in 2-D the visual image of its subject, and the 3DVT utilizes the unique properties of a hologram to capture in full 3-D, including depth, the visual image of its subject. The 2DVT and 3DVT will enable the worker to clearly see the precise location or path, for example, of the component that is to be added to the object to be manufactured at that point in the manufacturing process. The 2DVT and 3DVT also allow for clear and effective visual emphasis or instruction regarding the step to be accomplished without the risk of translational errors, language impediments, learning curves or other problems associated with operator fatigue and training.

A representational image may be created by hand, using conventional photography or by computer aided design. These representational images can be superimposed onto a workpiece where a simple two-dimensional representational image (2DRI) is sufficient for the operation being contemplated, such as, for example, component assembly, painting, the cutting of fabric or the location of a bend or cut in a workpiece. The superimposition of these representational images may be accomplished, using, for example, a slide or computer image projector, an overhead projector, a high intensity computer display, an optical combiner, a prismatic screen, a splitter, or some other form of image projection or display, including using a computer controlled display, such as, for example, a liquid crystal display (LCD), a plasma display, a light emitting diode (LED) display, spacial light modulator, fiber optics, or any other display that can either project an image onto or superimpose an image with an object (actually or virtually) using a light or other visible energy source, or allow light to pass through for projecting or superimposing an image of the displayed information directly or indirectly, thereby causing a superimposition of the image and the object.

The representational images may also be created or prepared in one location and digitized and transmitted to a remote location, for example, via the internet, a LAN, WAN or other intranet, or via a storage medium, such as, for example, CD-ROM, DVD, optical, magnetic, electronic or some other form of currently known or future developed storage media or transmission method or medium.

For example, where an advertisement is to be placed on the side of a truck or bus by painting or through the application of preprinted materials, such as decals, a 2DRI including an outline of the image or of the preprinted materials may be projected onto or superimposed with the surface, thereby simplifying the task for the operator and allowing the application or painting to be accomplished quickly and efficiently, and with fewer errors.

In certain applications, for example, where the object being worked on has a curved surface, a two dimensional representational image may be projected onto or superimposed with the surface using a holographic optical element (HOE) to affect the necessary curvature of the representational image on the surface. For example, where the painting or preprinted materials application is to be accomplished on an airplane fuselage, due to the curvature of the fuselage, projecting the 2DRI directly onto the fuselage will create undesirable curvature of the painted image or inaccurate positioning of the preprinted materials. Projecting or superimposing the 2DRI using a HOE will compensate for and correct any curvature of the projected or superimposed image due to the curvature of the surface. Thus, the painted image will be accurately represented on the surface and the preprinted materials will be properly positioned.

Where the operator is positioned near the object, an optical combiner interposed between the operator and the workpiece may be used. For example, one type of optical combiner that can be used is a clear glass sheet that can be partially silvered such that some of the light (from the first object, the workpiece) passes straight through the combiner to reach the operator's eyes; while the light from a second object (a projector, or computer display projecting the 2DRI, which may be positioned at 90 degrees to the workpiece) is reflected off of the combiner to also reach the operator's eyes. In this way, two independent objects, the work piece and the 2DRI information can be viewed at the same time and their virtual position relative to each other can be adjusted so that they can appear to occupy the same space at the same time—to the operator.

For more complex operations, where a three dimensional image is necessary to understand the complexities of the operation or the workpiece, such as detailed or multi-layer component assembly, and workpiece formation using punches or dies where depth or height constraints are critical and/or there are complex curvatures of the surface, a holographic representational image may be utilized.

According to the present invention a holographic representational image (HRI) may be created using a variety of holographic techniques, including traditional holographic techniques, and and the technique described in U.S. Pat. No. 5,748,347 ("V-3D3"). The HRI is created in a manner in which it can be integrated into the task or analysis that is to be accomplished, in most instances with the imagery superimposed with the workpiece. The task or analysis is then performed in a manner whereby the HRI and the information contained therein are used to improve the efficiency and effectiveness of the task and/or analysis being done, for example, by using the image to identify or verify the location or position of a part or component.

For example, in a manufacturing process, a two dimensional representational image (2DRI) or a holographic representational image (HRI) of an object to be manufactured may be created. The number of 2DRIs or HRIs used for a manufacturing process may depend, for example, on the number of stages in the manufacturing process, i.e., the number of workstations or assembly points in the manufacturing line, and/or the number of steps or tasks accomplished at each workstation or assembly point. For a multiple stage manufacturing process having a single step or task performed at each of the multiple workstations or assembly points, multiple 2DRIs or HRIs may be created using any of the various known techniques or techniques described herein, such as, for example, holographic techniques, including traditional holographic techniques and V-3D3. Each 2DRI or HRI created corresponds to a particular stage and step or stages and/or steps of the manufacturing process. Thus, each stage or stages of the manufacturing process may be represented by one or more separate 2DRIs or HRIs that include information that correspond to the step or task, or steps or tasks to be accomplished at that stage or those stages of the manufacturing process.

For a single or multiple stage manufacturing process having multiple steps or tasks at a single workstation or assembly point, or at multiple workstations or assembly points, single HRIs, multiple HRIs, compound HRIs, or any combinations thereof may be used. Alternatively, 2DRIs, multiple 2DRIs or compound 2DRIs may be used, any combinations thereof or any combinations of HRIs and 2DRIs. For each stage of the manufacturing process the type of 2DRI or HRI used may vary depending on the number and types of steps or tasks to be accomplished. Single HRIs are HRIs having one image contained therein. Multiple HRIs is a group of single HRIs, each representing one of multiple steps performed at a single stage or multiple stages of the manufacturing process. Likewise, multiple 2DRIs is a group of single 2DRIs, each representing one of multiple steps performed at a single stage or multiple stages of the manufacturing process. A compound HRI is a single HRI containing multiple images. A compound 2DRI is a single 2DRI containing multiple images. Compound HRIs and 2DRIs will be described in greater detail below.

Where a single HRI or 2DRI is used at a stage of the manufacturing process, one or more pieces of information may be included in the HRI or 2DRI. For example, if there are three components that are to be added to the product being manufactured at a single stage or assembly point, the locations of one or more of these three components in the product to be manufactured may be indicated in a single HRI or 2DRI. The operator must be able to distinguish between these three components to accomplish the steps or tasks effectively.

Where multiple HRIs or 2DRIs are used at each of the stages of the manufacturing process, a single piece of information or multiple pieces of information may be included in each of the HRIs or 2DRIs. For example, if there are four components to be added to a product being manufactured at a particular stage of the manufacturing process, the location of a single component may be indicated in a single HRI or 2DRI, thus requiring four separate HRIs or 2DRIs to provide the information regarding the four components necessary to complete this stage of the manufacturing process. Using the four HRIs or 2DRIs, this stage of the manufacturing process would be accomplished in four steps. Alternatively, the locations of each of the four components may be indicated in a single HRI or 2DRI, thus requiring a single HRI or 2DRI to accomplish the four steps or tasks included in this stage of the manufacturing process. Another option is to combine HRIs and/or 2DRIs having single and/or multiple pieces of information to accomplish the steps or tasks required at the particular stage of the manufacturing process. For example, if there are four components to be added to the product being manufactured at a particular stage of the manufacturing process, the location of a first component may be indicated in a single HRI or 2DRI and the location of the three other components may be indicated in a separate HRI or 2DRI. This combination of HRIs and/or 2DRIs containing different amounts of information would require the use of only two HRIs and/or 2DRIs to accomplish the steps or tasks necessary for that stage of the manufacturing process.

A manufacturing process can use multiple 2DRIs or HRIs by switching between each of the single 2DRIs and/or HRIs. This can be done mechanically, such as, for example, by rotating a positioning device in which each of the 2DRIs or HRIs is positioned or by moving the object to be manufactured, or electronically, such as, for example, by utilizing computer generated 2DRIs and switching between the computer generated 2DRIs. There are many other ways to accomplish such switching.

Using multiple HRIs or 2DRIs may be difficult at times since the amount of space available may be limited, or it may require, for example, the physical switching or moving of the HRIs or 2DRIs from one location to another and or repositioning of the object being manufactured. To reduce or eliminate these physical constraints, compound HRIs and/or 2DRIs may be used. By using a compound HRI or 2DRI the multiple steps or tasks required at a particular stage of the manufacturing process may be accomplished effectively and efficiently. A compound HRI is a single HRI having multiple sets of information contained therein. A compound 2DRI is a single 2DRI having multiple sets of information contained therein. Each of the sets of information contained in a compound HRI or 2DRI may be accessible in a number of different ways, including, for example, by viewing the HRI or 2DRI at different angles or positions, by viewing the HRI or 2DRI under lights of different wavelengths, by viewing the HRI or 2DRI from different distances, by placing the HRI or 2DRI at different distances from the workpiece, and by illuminating the HRI or 2DRI at different angles. A compound HRI can be created using the V-3D3 process or conventional holography. A compound 2DRI can be created using conventional photography, printing, or using a computer controlled display, such as, for example, a liquid crystal display (LCD), a plasma display, a light emitting diode (LED) display, spacial light modulator, fiber optics, or any other display that can either project or superimpose an image using a light or other visible energy source, or allow light to pass through for projecting or superimposing an image of the displayed information.

A compound 2DRI using a single transparency may be created in a number of different ways. For example, the two dimensional information may first be scan analyzed into the necessary subcomponents, for example, vertical or horizontal stripes. These sub-components are correlated with one or more lenticulated lens elements. The sub-components from a first set of two dimensional information can then be interposed with the sub-components from a second set (or more sets) of two dimensional information in a fixed relationship. The resulting series of sub-components, for example, stripes, are situated in a predetermined spatial relationship to the lenticulated lens/filter, for example, by laminating or printing the stripes in register with the lenticulated lens/filter. The resulting compound 2DRI will present each of the sets of two-dimensional information, for example, images, to the projection optics (which can be similar to that from a slide projector) when the lenticulated side of the 2DRI is illuminated from a particular off-axis angle. Alternatively, the sub-components may be correlated with one or more polarizing filter. Each set of 2-D information will be presented upon illumination by light having the corresponding polarization.

A compound 2DRI using a single transparency may also be created using color separation techniques, for example, by providing the representation of each set of two dimensional information in a different color or corresponding to a different wavelength of light. The projection optics would then present each of the sets of two-dimensional information using a light source of a different color or wavelength, for example, by using colored filters.

After creation of each 2DRI and/or HRI to be used in the manufacturing process, the 2DRIs and/or HRIs must be physically arranged so that the information contained in the 2DRIs and/or HRIs, for example, information regarding the location of a specific component to be inserted during the manufacturing process or the location, position, or shape of a cut or bend, may be utilized by the operators at the various stages of the manufacturing process. This may be accomplished by removably positioning each of the 2DRIs and/or HRIs at their corresponding stages of the manufacturing process in fixed or adjustable relation to the location of the object to be manufactured. The object to be manufactured is placed in a predetermined position, which may be fixed or adjustable by the operator. The 2DRI or HRI is then coupled to, or positioned on or in a mounting or positioning device, which is either fixed or adjustable, at some predetermined or adjustable distance from the object to be manufactured. A light source is then positioned in such a way that the information contained in the 2DRI or HRI may be utilized by an operator, for example, by projecting or superimposing the 2DRI or HRI information onto or with the object to be manufactured, directly or indirectly, such that the 2DRI or HRI information and the object are superimposed, i.e., they overlap, and for the HRI they are substantially in register or near register in all three dimensions, including depth. These steps may be repeated for each stage of and step in the manufacturing process, or for as many stages and/or steps as desired. As the object moves through the stages of the manufacturing process, at each stage and for each step the 2DRI or HRI information is available to the operator, for example, by being projected onto or superimposed with the object to be manufactured, thereby clearly indicating to the operator the required task, for example, the location of the component to be inserted or the location, position or shape of a cut or bend.

Thus, the manufacturing process will include a new source of information for the operators that will provide improved guidance, for example, through the use of a Two or Three Dimensional Visual Template (2DVT or 3DVT) type of representational image presented in superimposition with the object to be manufactured. This 2DVT or 3DVT representational image can be used by the operator to identify the task to be performed, for example, the location of the component on the object being manufactured or the position or shape of a cut or bend. The 2DVT utilizes the projected or superimposed image to capture in 2-D the visual image of its subject, and the 3DVT utilizes the unique properties of the hologram to capture in full 3-D, including depth, the visual image of its subject.

For a manufacturing process having multiple steps or tasks at each stage, for example, in the construction of a digital clock, where the circuit board is constructed at one stage, in multiple steps, the display at another stage, also in multiple steps, etc., a single 2DRI or HRI may be used for a single step or task, thereby requiring multiple 2DRIs or HRIs to be used to accomplish the necessary steps or tasks at a particular stage of the manufacturing process. To accomplish the various steps, the operator is provided access to the information contained in each 2DRI or HRI and is able to cycle or switch between each of the multiple 2DRIs and/or HRIs that are utilized. This may be accomplished by successively displaying the various 2DRIs and/or HRIs and allowing the operator to view the information contained in each 2DRI and HRI and accomplish the task to which such 2DRI or HRI corresponds, before displaying the next 2DRI and/or HRI. For example, by using a mounting or positioning device with a rotating portion, the various 2DRIs and/or HRIs may be coupled to, or positioned on or in a mounting or positioning device, which is either fixed or adjustable, at some predetermined or adjustable distance from the object to be manufactured, in planar fashion. As the rotating portion rotates within a plane substantially parallel to the plane in which the object to be manufactured is positioned, the various 2DRIs and HRIs can be moved into a position from which the information from the 2DRI or HRI can become substantially in register with the object to be manufactured. A light source is positioned as described above in a manner that will allow the information contained in the 2DRI or HRI to be utilized by an operator, for example, by projecting or superimposing the 2DRI or HRI information onto or with the object to be manufactured such that the projected or superimposed 2DRI or HRI information and the object are substantially in register or near register. When the operator has completed the required task, the apparatus may be rotated so as to move the next 2DRI or HRI into the proper position for the next operation.

When a compound HRI is used to provide the representational images to be used during the manufacturing process, the different sets of information contained in the compound HRI may be accessible by viewing the HRI at different angles or from different positions. This may be accomplished by placing the HRI in an adjustable positioning device. The positioning device may be adjustable by fixed or variable increments. After the first set of information is accessed by the operator through illumination of the HRI, as described above, the HRI may then be repositioned, for example, by moving the HRI horizontally, vertically, diagonally or a combination thereof. The HRI is then illuminated again to allow the operator to access the next set of information. This process is continued until all of the information contained in the HRI necessary for the operator to accomplish each required step or task is accessed. Similarly, the different sets of information contained in a compound 2DRI may be accessible by illuminating the 2DRI from different angles either by moving the 2DRI or the light source as described above. This may be accomplished by placing the 2DRI in an adjustable positioning device as described above for the HRI.

Accessing the various sets of information in a compound 2DRI or HRI may also be accomplished by viewing the 2DRI or HRI under lights of different wavelengths. First the 2DRI or HRI is placed in a positioning device, as described above. The 2DRI or HRI is then illuminated using a light source of a first predetermined wavelength. This allows the operator to access the first set of information contained in the 2DRI or HRI. After the operator has completed the step for which the first set of information was accessed, the 2DRI or HRI is illuminated using a light source of a second predetermined wavelength. This process is continued until all of the information contained in the 2DRI or HRI necessary for the operator to accomplish each required step or task is accessed.

Accessing the various sets of information in a compound 2DRI or HRI may also be accomplished by viewing the 2DRI or HRI from different distances. First the HRI is placed in a positioning device, as described above. The 2DRI or HRI is adjusted to a position at a first predetermined distance from the plane of the object to be manufactured, i.e., a first predetermined focal point. This allows the operator to access the first set of information contained in the 2DRI or HRI. After the operator has accessed the first set of information through illumination of the 2DRI or HRI, as described above, the 2DRI or HRI is then repositioned, for example, by moving the 2DRI or HRI toward or away from the object to be manufactured, i.e., to a second predetermined focal point. The 2DRI or HRI is then illuminated again to allow the operator to access the next set of information. This process is continued until all of the information contained in the 2DRI or HRI necessary for the operator to accomplish each required step or task is accessed. Alternatively, the various sets of information contained in a compound 2DRI or HRI may be accessible by viewing the 2DRI or HRI from different distances from the plane of the 2DRI or HRI, or by moving the object to be manufactured toward or away from the 2DRI or HRI. To provide for this type of viewing, the 2DRI and HRI must be created with the different sets of information at different distances or focal points from its surface, with a corresponding change in the light source distance or projection optics.

Accessing the various sets of information in a compound 2DRI or HRI may also be accomplished by illuminating the 2DRI or HRI at different angles. This may be accomplished by placing the 2DRI or HRI in a positioning device. The light source used to illuminate the 2DRI or HRI may be adjustable by fixed or variable increments or multiple adjustable light sources may be used. The light source is placed in a first predetermined position, or a first light source (located at a first predetermined position) may be used. The 2DRI or HRI is then illuminated allowing the operator to access the first set of information located therein. After the operator accesses the first set of information, the light source may then be repositioned, for example, by moving the light source horizontally, vertically, diagonally or a combination thereof, or a second light source may be used. Alternatively, the 2DRI or HRI may be repositioned. The 2DRI or HRI is then illuminated again to allow the operator to access the next set of information. This process is continued until all of the information contained in the 2DRI or HRI necessary for the operator to accomplish each required step or task is accessed.

Utilizing a compound 2DRI or HRI, a multiple stage manufacturing process may be consolidated into a single physical stage and/or numerous steps of a manufacturing process may be consolidated so as to be accomplished by a single operator, thereby reducing the physical size of the manufacturing line and reducing the number of operators. The time required for training may also be reduced, for example, because all of the tasks to be accomplished will be viewable as a projected or superimposed image on the workpiece, which will serve as a template for the operator.

The quality assurance (QA) and quality control (QC) processes may also be enhanced and improved using 2DRIs and/or HRIs. For example, instead of a manual QA/QC review by an inspector who must identify every component in the object being manufactured and verify the accurate placement of each component, usually by reference to a schematic or model, the QA/QC review can be made using a 2DRI or HRI. Using a 2DRI or HRI allows the comparison of the finished workpiece to the model or schematic to be accomplished using a projected or superimposed image of the desired final product with all of the necessary components. This can be achieved by utilizing multiple 2DRIs and/or HRIs with each component represented by an individual 2DRI or HRI, single 2DRIs or HRIs each having a plurality of components for projection onto or superimposition with the manufactured object, a compound 2DRI or HRI with each of the sets of information, e.g., components, viewed using one of the techniques described above, or any combination of the above. Since each of the manufactured objects can be QA/QC inspected using a 2DRI or HRI or 2DRIs or HRIs, there can be 100% QA/QC for every object manufactured.

Using 2DRIs and/or HRIs, the QA/QC inspection process may become partially or even fully automated. After all of the manufacturing steps have been completed, the finished product may be sent to another station. At this station, the QA/QC review is begun. A 2DRI or HRI is positioned in fixed or adjustable relation to the finished product. The information contained in the 2DRI or HRI is projected or superimposed onto the finished product. An inspector or an automated detection device, such as, for example, a machine vision system, or both, view the finished product with the projected or superimposed 2DRI or HRI information and make a determination as to whether the finished product has passed inspection. If the finished product does not pass inspection, the inspector and/or the automated detection device will then be able to identify the specific items that caused the failed inspection. The finished product may then be sent back to the corresponding location(s) in the manufacturing process to correct what caused the failed inspection. A compound 2DRI or HRI can be used in place of a single 2DRI or HRI, respectively, by using one of the processes described above to project or superimpose, in succession, the various sets of information contained in the compound 2DRI or HRI onto the finished product for a QA/QC inspection. For example, each of the sub-assembly images could be superimposed on the work piece in quick succession to confirm that each element that was to be added in the production line is in place and in the correct location. Such inspection could identify faulty pieces instantly, as well as which workstation would need to do the revision on the piece to achieve Zero Defects.

For example, the 2DRI and/or HRI can be used in conjunction with a machine vision system to effectively take over a portion of the QA/QC inspection. In place of a human inspector, the machine vision system would detect errors in a workpiece by a comparison of the workpiece to the image of the correct object as projected or superimposed by the 2DRI or HRI. The machine vision system could then identify whether any errors exist and any necessary revisions. The machine vision system could also compile information about the manufacturing assembly line, for example, relating to which steps and/or workers exhibit above average or above normal error rates.

The language free aspect of the present invention is also significant considering the expanding use of a multinational workforce and overseas manufacturing, and the cost savings associated with centralizing any training operations. Additionally, with the use of low cost labor, there is often a language issue since quite often English is the first the language of the management and training department, while the first language of such labor force is not English.

Finally, many products are currently designed to minimize the use of handwork, however this comes at a high robotic cost. Not only must the assemblies be designed to match the capabilities of the robotic systems (sometimes requiring sub-optimal design of the assembly), but the cost to the manufacturer for model changes can be quite high because of the cost of reprogramming the robots that do the assemblies. Using the present invention will provide companies with the ability to achieve very near 'robotic' manufacturing quality (very low reject rates) and provide the ability to have workers trained efficiently and cost effectively and adapt very quickly to changes in the assembly line, new assembly requirements, and different products. The present invention will provide companies with a way to decrease the overall cost of manufacture and QA/QC, while maintaining the same or even higher quality standards.

DETAILED DESCRIPTION

Figure 1A:
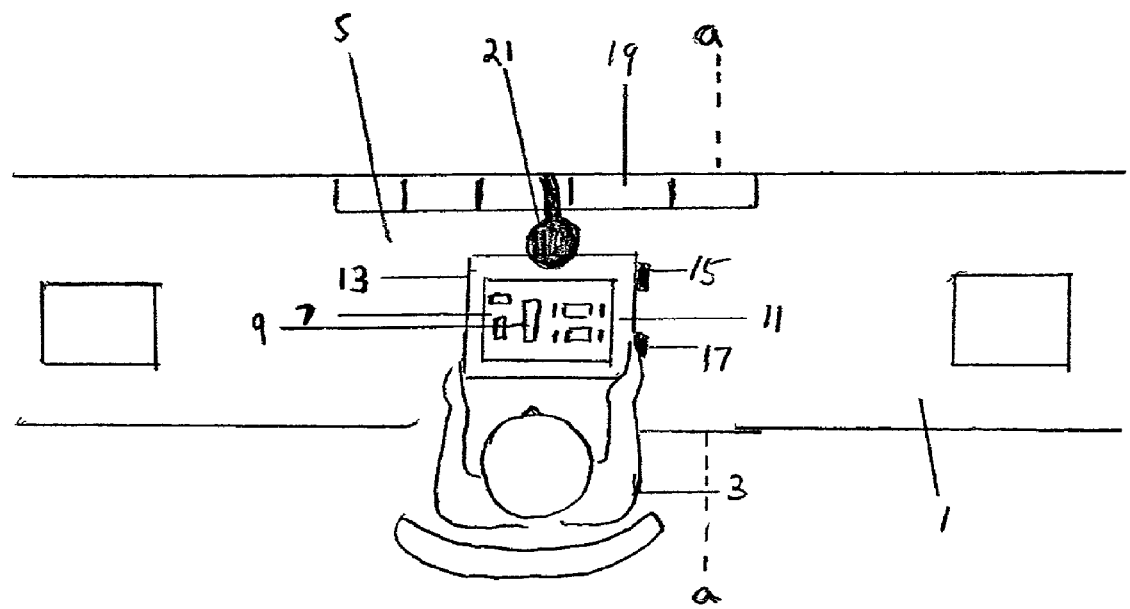
FIGS. 1(a) and 1(b) show a top view and a side view (along a plane defined by points a-a), respectively, of a positioning and setup operation according to an embodiment of the present invention.
Figure 1B:
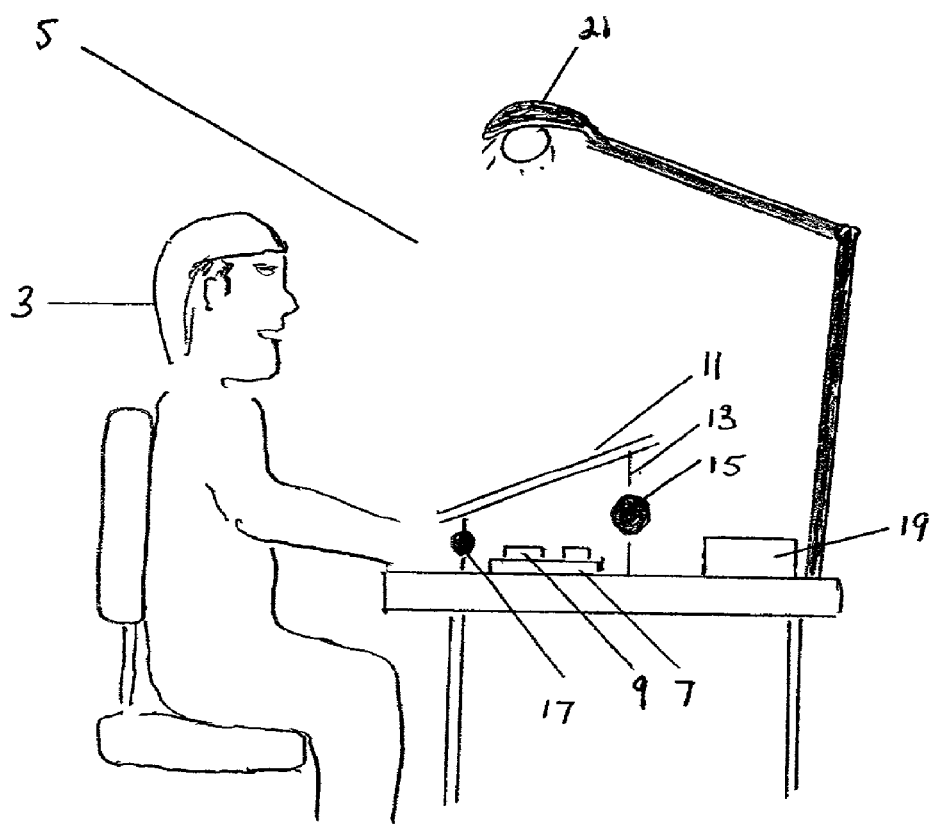

Referring first to FIGS. 1(a) and 1(b), there is shown a top view and a side view (along a plane defined by points a-a), respectively, of a positioning and setup operation according to an embodiment of the present invention. FIGS. 1(a) and 1(b) show a manufacturing assembly line 1 where an operator 3 at a step 5 of the manufacturing process is working on the assembly of a product. The product is assembled using a sub-frame 7 and a number of components. At this step 5 of the manufacturing process, the operator 3 is responsible for the insertion and connection of a component 9 onto the sub-frame 7. Before any assembly is performed, an HRI 11 is created using traditional holographic techniques. Alternatively, HRI 11 could be a 2DRI.

The information contained in the HRI 11 includes a representational image of the sub-frame 7 having the same shape, dimensions and physical structure as the actual sub-frame 7 when viewed in its proper position of assembly at step 5 of the manufacturing process. The HRI 11 also includes a representational image of the component 9 that is to be added during step 5 in its proper position of assembly. Once created, the HRI 11 is positioned on or in an adjustable frame 13 that is coupled to the work area adjacent to the operator 3. The adjustable frame 13 may be positioned using a first positioning device 15 or a second positioning device 17, which may be, for example, a rotating knob or lever connected to a mechanical gear or mechanism, a mechanical assembly, or an electronic switch connected to a motor. Alternatively, both the first positioning device 15 and the second positioning device 17 may be used to position the adjustable frame 13 or additional positioning devices may be used. The sub-frame 7 is positioned in correlation to the HRI 11. Prior to adjusting the position of the adjustable frame 13, the HRI 11 is illuminated by light source 21. Upon illumination of the HRI 11 by light source 21, the representational image stored in the HRI 11, including the holographic 3-dimensional image of the sub-frame 7 and the component 9, is superimposed with the actual sub-frame 7. Once the representational image contained in the HRI 11 is superimposed with the actual sub-frame 7, the adjustable frame 13 is then adjusted using one or both of the first positioning device 15 and the second positioning device 17, until the representational image presented by the HRI 11 is substantially in or near register with and appears to overlap the actual sub-frame 7. The first positioning device 15 and the second positioning device 17 may then be fixed in position. Alternatively, the sub-frame 7 may be adjusted until the representational image presented by the HRI 11 is substantially in or near register with and appears to overlap the actual sub-frame 7.

Figure 2:
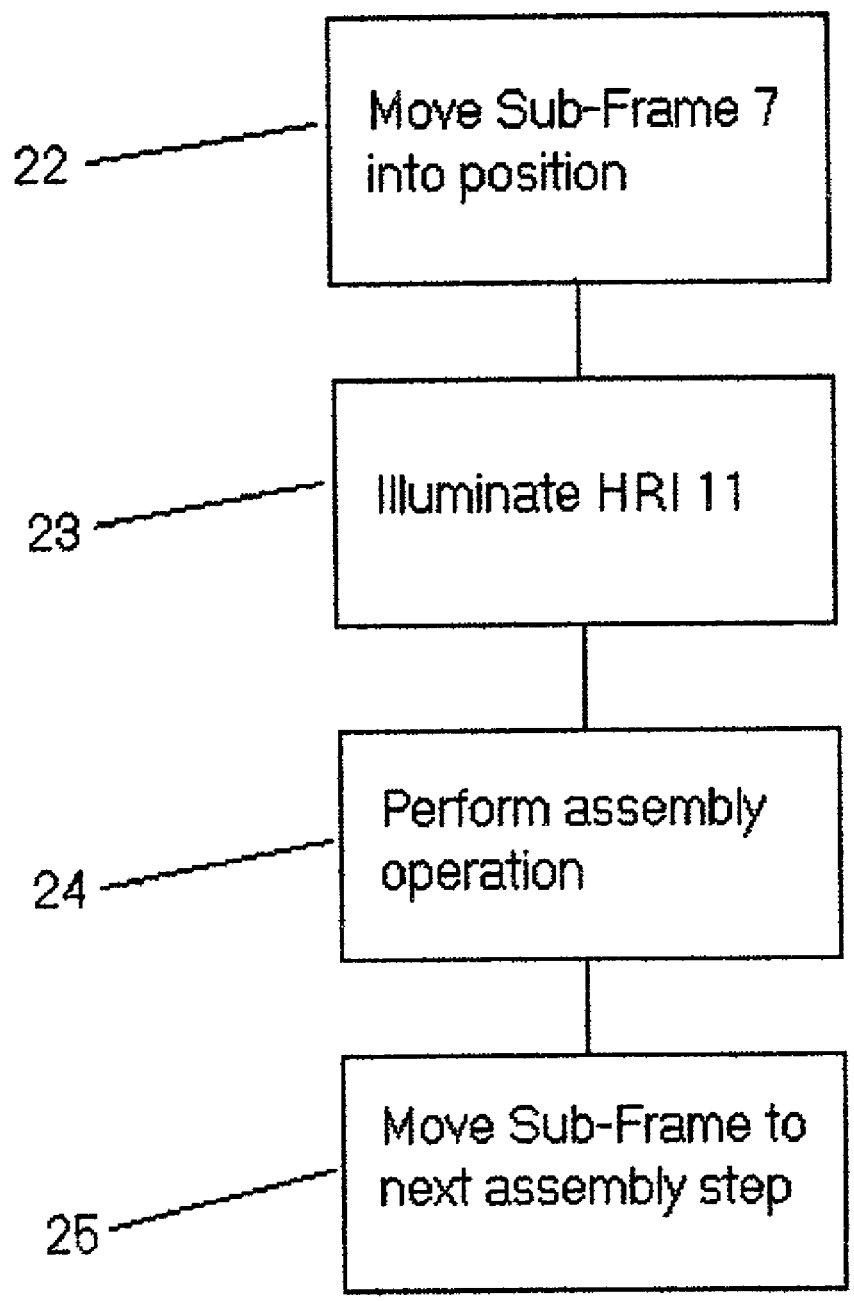
FIG. 2 shows a flow diagram of an assembly operation according to an embodiment of the present invention.

Referring now to FIG. 2, there is shown a flow diagram of an assembly operation according to an embodiment of the present invention. Once the HRI 11 is adjusted, the manufacturing assembly line may be operated. In a first step 22, each sub-frame 7 is moved into position at step 5 of the manufacturing assembly line 1. This is followed by step 23, where the HRI 11 is illuminated by the light source 21. Upon illumination of the HRI 11 by the light source 21, the representational image stored in the HRI 11, including a holographic 3-dimensional image of the sub-frame 7 and the component 9, is superimposed with the actual sub-frame 7. Once the representational image contained in the HRI 11 is superimposed with the actual sub-frame 7, in a next step 24, the operator 3 performs an assembly operation by placing the component 9 in the location corresponding to that indicated by the presented image of the component 9 with sub-frame 7. When assembly step 24 is completed, in a step 25, the sub-frame is moved to the next step of the manufacturing assembly line 1, where further assembly may be accomplished. The same operations as described above may be implemented for the next and any other stages of the manufacturing assembly line 1 as desired.

Figure 3A:
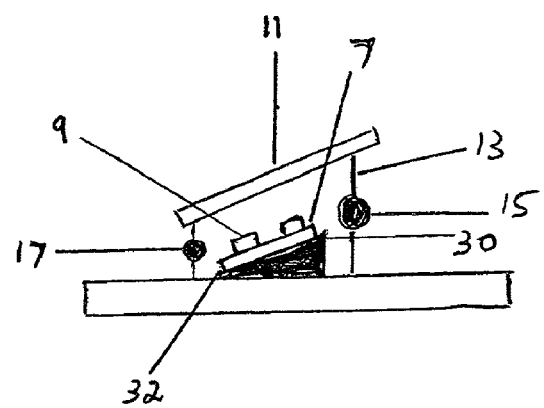
FIGS. 3(a) and 3(b) show positions for a sub-frame according to an embodiment of the present invention.
Figure 3B:
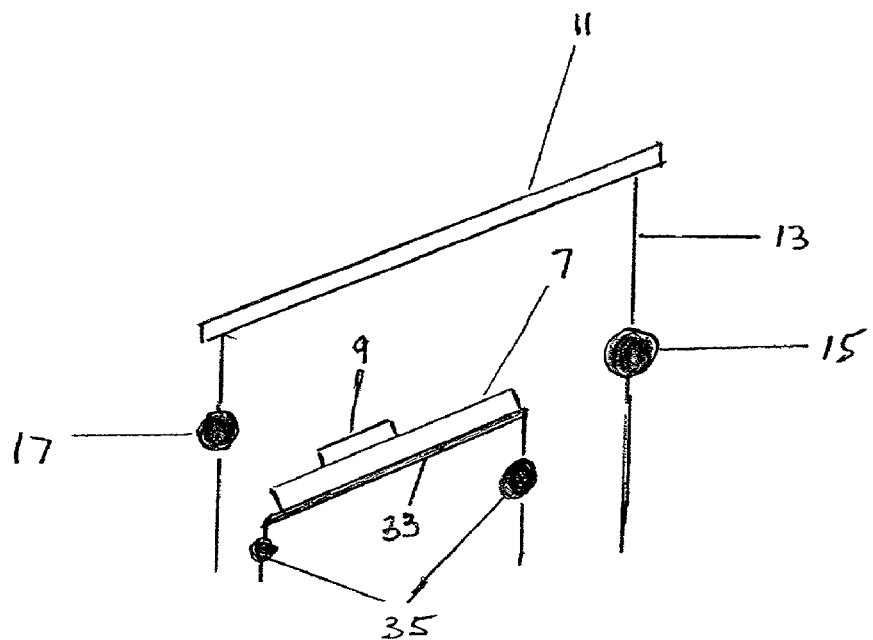

Referring now to FIGS. 3(a) and 3(b), there is shown a position for the sub-frame according to an embodiment of the present invention. Alternatively, as shown in FIG. 3(a), the sub-frame 7 may be positioned such that side 30, which is located furthest from the operator 3, is raised with respect to side 32, which is located nearest the operator 3. Thus, the sub-frame 7 may be positioned on a plane parallel to the plane on which the HRI 11 is positioned. Alternatively, as shown in FIG. 3(b), the sub-frame 7 may be positioned in or on an adjustable device 33, whereby the position of the sub-frame 7 may be adjusted relative to the HRI 11 using one or more of positioning devices 35. When all of the steps of the manufacturing assembly line 1 are initialized, the manufacturing assembly line 1 may be operated.

Figure 4:
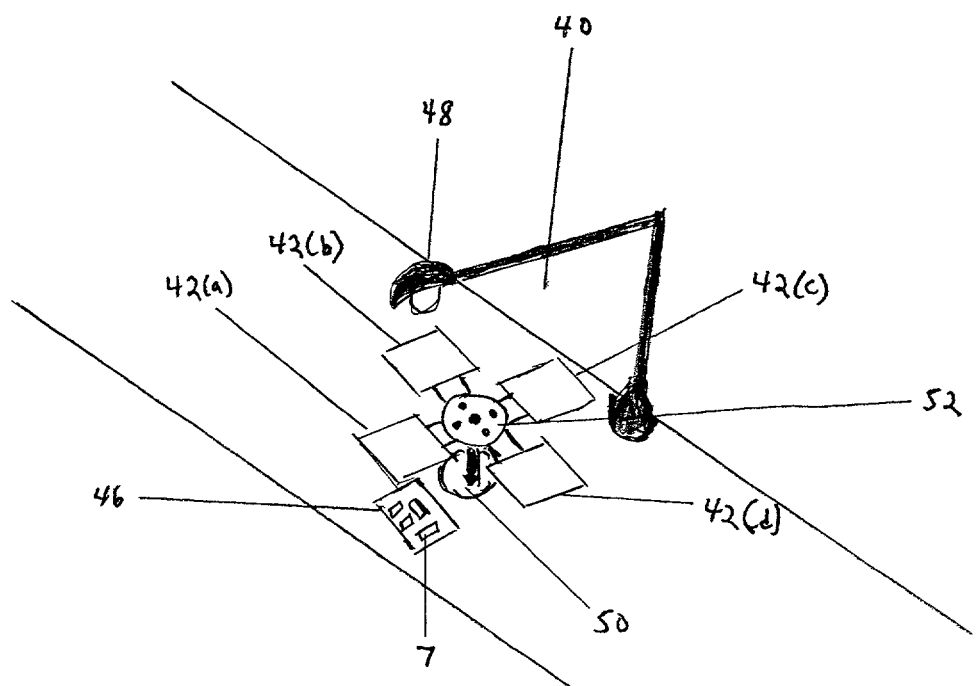
FIG. 4 shows a quality control/quality assurance procedure according to an embodiment of the present invention.

Referring now to FIG. 4, there is shown a quality control/quality assurance procedure according to an embodiment of the present invention. Upon completion of the assembly of the components on the sub-frame 7, the sub-frame 7 is moved to a quality control location 40. At quality control location 40 a plurality of HRIs 42, corresponding to the number of steps in the manufacturing assembly line 1, are adjustably (or fixedly) positioned in a fixed or adjustable frame 44. Alternatively, a compound HRI containing all or some of the information corresponding to the steps of the manufacturing assembly line 1, or any number of HRIs may be used. Each HRI 42 includes a representational image of a single component or a plurality of components in its or their proper location(s) on the sub-frame 7. The sub-frame 7, which is located in an assessment position 46, is positioned in correlation to HRI 42(a). The frame 44 may be adjusted so that upon illumination of the HRI 42(a) by light source 48, the representational image stored in the HRI 42(a), including the holographic 3-dimensional image of the sub-frame 7 and a single component or plurality of components, is superimposed with the actual sub-frame 7. Once the representational image contained in the HRI 42(a) is superimposed with the actual sub-frame 7, the frame 44 is then adjusted, if necessary, using one or both of a first positioning device 50 and a second positioning device 52, until the holographic representational image presented by the HRI 42(a) is substantially in or near register with and appears to overlap the actual sub-frame 7. The first positioning device 50 and the second positioning device 52 may then be fixed in position. The HRIs 42 are then alternated such that each is positioned in correlation to sub-frame 7 in assessment position 46, illuminated by light source 48 and assessed to determine if assembly was performed properly. Alternatively a 2DRI, multiple 2DRIs or a compound 2DRI may be used in place of HRIs 42.

Figure 5:
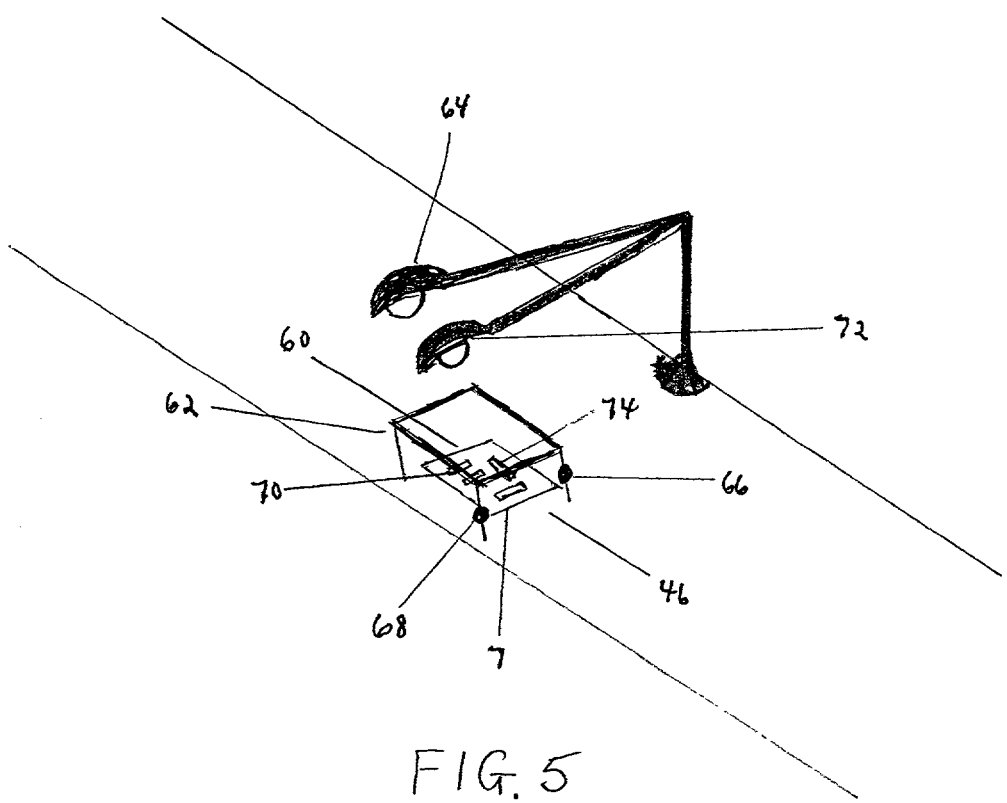
FIG. 5 shows a quality control/quality assurance procedure utilizing a compound HRI, according to an embodiment of the present invention.

Referring now to FIG. 5, there is shown a quality control/quality assurance procedure utilizing a compound HRI, according to an embodiment of the present invention. In place of the HRIs 42, alternatively, a compound HRI 60 may be used which contains some or all of the information contained in each or some of the HRIs 42. The compound HRI 60 is adjustably (or fixedly) positioned in a fixed or adjustable frame 62. The compound HRI 60 includes a plurality of representational images, each of a single component or a plurality of components in its or their proper location(s) on the sub-frame 7. The sub-frame 7, which is located in an assessment position 46, is positioned in correlation to compound HRI 60. The frame 62 may be adjusted so that upon illumination of the compound HRI 60 by a first light source 64, a first representational image of three-dimensional information stored in the compound HRI 60, including the holographic three-dimensional image of the sub-frame 7 and a single component or plurality of components, is superimposed with the actual sub-frame 7. Once the first representational image contained in the compound HRI 60 is superimposed with the actual sub-frame 7, the frame 62 is then adjusted, if necessary, using one or both of a first positioning device 66 and a second positioning device 68, until the first representational image presented by the compound HRI 60 is substantially in or near register with and appears to overlap the actual sub-frame 7. The first positioning device 66 and the second positioning device 68 may then be fixed in position. Alternatively, a compound 2DRI may be used in place of compound HRI 60.

When assessing the assembly of a product, the sub-frame 7 is positioned in assessment position 46 the compound HRI 60 in frame 62 is illuminated using the first light source 64 to present a first representational image of three-dimensional information stored in the compound HRI 60, including the holographic three-dimensional image of the sub-frame 7 and a single component or plurality of components, with the sub-frame 7 for assessing the assembly of a first component 70, or any number of components. The assessment may be accomplished by human review or by review using an automated detection device, such as, for example, a machine vision system. The first assessment includes a comparison of the superimposed first representational image to the first component 70 on the sub-frame 7 to determine if there is uniformity.

The compound HRI 60 is then illuminated by a second light source 72. A second representational image of three-dimensional information stored in the compound HRI 60, including the holographic three-dimensional image of the sub-frame 7 and a single component or plurality of components, is superimposed with the actual sub-frame 7 for assessing the assembly of a second component 74, or any number of components. The assessment may be accomplished by human review or by review using an automated detection device. The second assessment includes a comparison of the superimposed second representational image to the second component 74 on the sub-frame 7 to determine if there is uniformity. These steps are repeated for as many representational images as desired, for example, as many as are included in the compound HRI 60 or in the product, each time using a different light source, and until an assessment has been made of the assembly of all or a selected number of the components. For each component or each group of components a new light source is used to illuminate the compound HRI 60 and present a new representational image of three-dimensional information stored on the compound HRI 60.

Figure 6A:
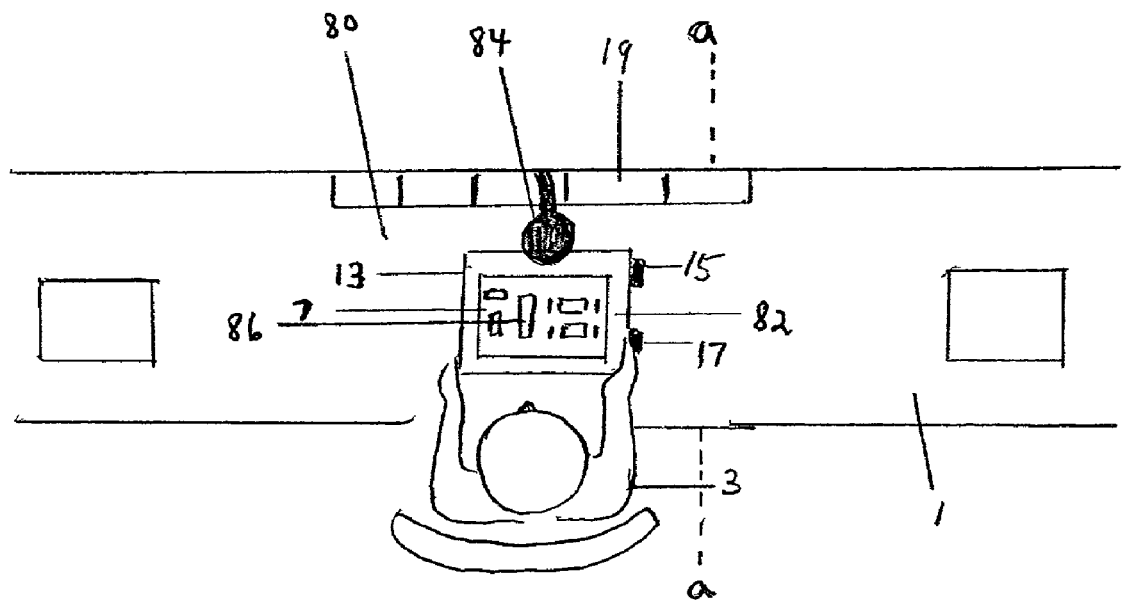
FIGS. 6(a) and 6(b) show a top view and a side view (along a plane defined by points a-a), respectively, of a positioning and setup operation according to an embodiment of the present invention.
Figure 6B:
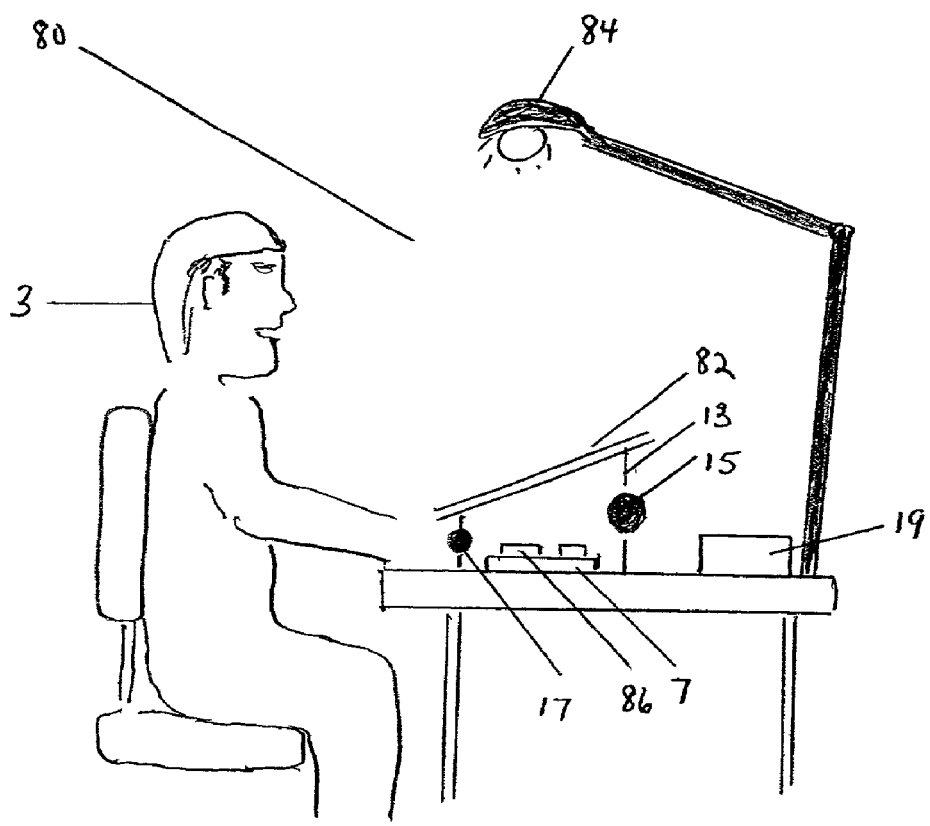

Referring now to FIGS. 6(*a*) and 6(*b*) (which for all identical components utilize the numbering from FIGS. 1(*a*) and 1(*b*)), there is shown a top view and a side view (along a plane defined by points a-a), respectively, of a positioning and setup operation according to an embodiment of the present invention. FIGS. 6(*a*) and 6(*b*) show a manufacturing assembly line 1, where an operator 3 at a station 80 of the manufacturing process is working on the assembly of a product. The product is assembled using a sub-frame 7 and a number of components. At this station 80 of the manufacturing process, the operator 3 is responsible for the performance of a number of steps of the assembly, including the insertion and connection of a plurality of components onto the sub-frame 7.

Before any assembly is performed, a compound HRI 82 is created using V-3D3 techniques as described in U.S. Pat. No. 5,748,347. The information contained in the compound HRI 82 includes a plurality of representational images of the sub-frame 7 having the same shape, dimensions and physical structure as the actual sub-frame 7 when viewed in its proper position of assembly at station 80 of the manufacturing process. The compound HRI 82 also includes representational images of the components that are to be added during a plurality of steps performed at station 80 in their proper positions of assembly. Once created, the compound HRI 82 is positioned on or in an adjustable frame 13 that is coupled to the work area adjacent to the operator 3. The adjustable frame 13 may be positioned using a first positioning device 15 or a second positioning device 17, which may be, for example, a rotating knob or a lever connected to a mechanical gear or mechanism, a mechanical assembly, or an electronic switch connected to a motor. Alternatively, both the first positioning device 15 and the second positioning device 17 may be used to position the adjustable frame 13. The sub-frame 7 is positioned in correlation to the compound HRI 82.

Prior to adjusting the position of the adjustable frame 13, the compound HRI 82 is illuminated by a first light source 84. Upon illumination of the compound HRI 82 by the first light source 84, a first representational image stored in the compound HRI 82, including a holographic 3-dimensional image of the sub-frame 7 and a first component 86, is superimposed with the actual sub-frame 7. Once the first representational image contained in the compound HRI 82 is superimposed with the actual sub-frame 7, the adjustable frame 13 is then adjusted using one or both of the first positioning device 15 and the second positioning device 17, until the first representational image presented by the compound HRI 82 is substantially in or near register with and appears to overlap the actual sub-frame 7. The first positioning device 15 and the second positioning device 17 may then be fixed in position. Alternatively, a compound 2DRI may be used in place of compound HRI 82.

Figure 7:
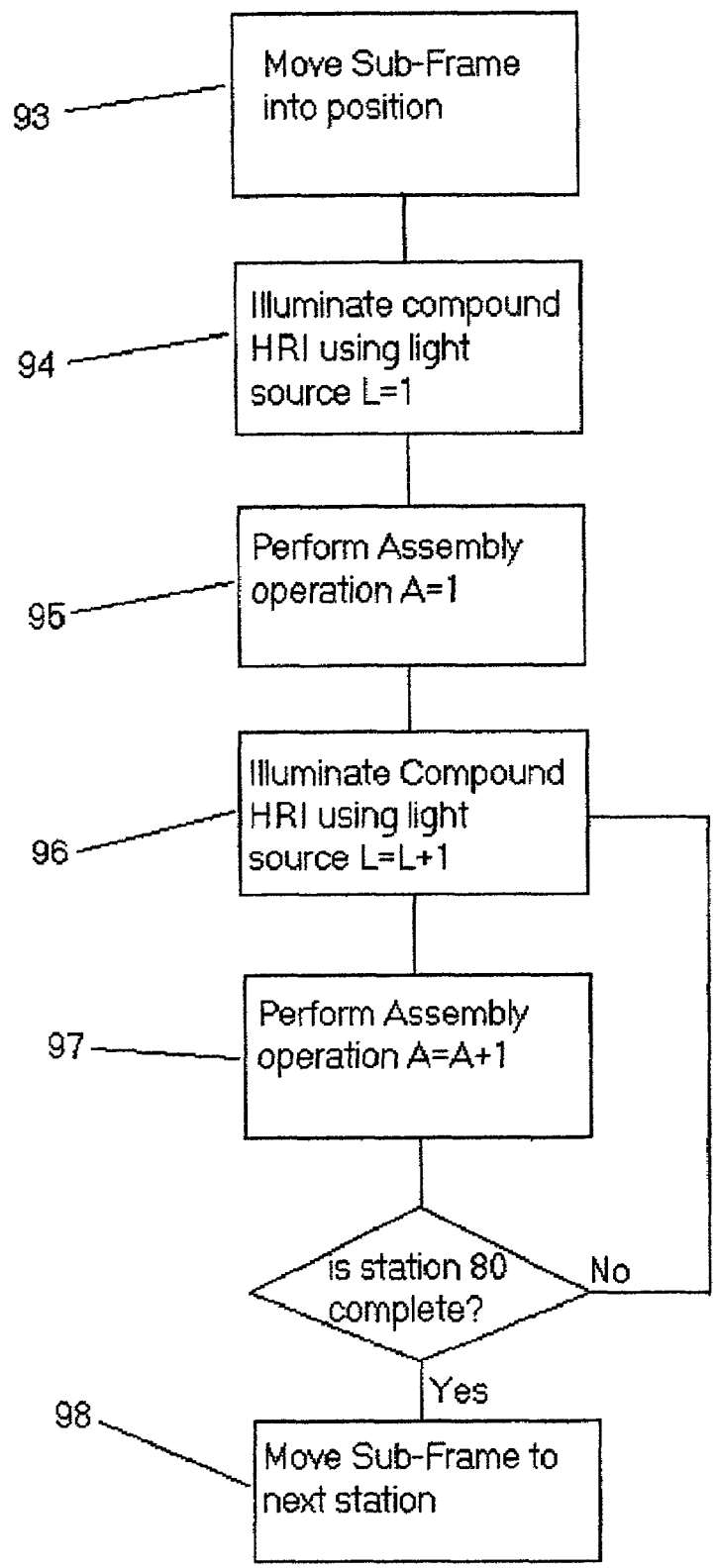
FIG. 7 shows a flow diagram of an assembly operation according to an embodiment of the present invention.

Referring now to FIG. 7, there is shown a flow diagram of an assembly operation according to an embodiment of the present invention. Once the compound HRI 82 is adjusted, the manufacturing assembly line may be operated. In a first step 93, each sub-frame 7 is moved into position at station 80. In the next step 94, the compound HRI 82 is illuminated by a first light source 84. Upon illumination of the compound HRI 82 by the first light source 84, a first representational image stored in the compound HRI 82, including a holographic 3-dimensional image of the sub-frame 7 and a first component 86, is superimposed with the actual sub-frame 7. Once the first representational image contained in the compound HRI 82 is superimposed with the actual sub-frame 7, in a next step 95, the operator 3 performs a first assembly operation by placing the first component 86 in the location corresponding to that indicated by the superimposed image of the first component 86 with sub-frame 7. When assembly step 95 is completed, in step 96 the first light source 84 is removed and compound HRI 82 is then illuminated by a second light source 88. Upon illumination of the compound HRI 82 by the second light source 88, a second representational image stored in the compound HRI 82, including a holographic 3-dimensional image of the sub-frame 7 and a second component 90, is superimposed with the actual sub-frame 7. Once the second representational image contained in the compound HRI 82 is superimposed with the actual sub-frame 7, in step 97 the operator 3 performs a second assembly operation by placing the second component 90 in the location corresponding to that indicated by the superimposed image of the second component 90 with sub-frame 7. These operations are repeated for as many steps as are performed at station 80, or for as many representational images as are included in the compound HRI 82. For each representational image a different light source is used to illuminate the compound HRI 82. Upon completion of the station 80 assembly steps, in step 98, the sub-frame 7 is moved to a new station on the manufacturing assembly line 1 and these operations may be repeated.

The QC/QA process may be performed as described with reference to FIG. 5, or alternatively, the QC/QA process may be integrated with the assembly process as described above with respect to FIG. 6. An integrated QC/QA process may be accomplished using the representational images stored in the compound HRI 82. In addition to the information included in each representational image contained in the compound HRI 82, i.e., a holographic 3-dimensional image of the sub-frame 7 and the first component 86, as described above, the compound HRI 82 must also include the component or components from the prior assembly step or steps of the manufacturing assembly line 1. Each step of the manufacturing assembly line 1 can check the assembly from the prior step or from any number of prior steps.

For example, if each step incorporates a QC/QA inspection of the assembly performed at the prior step, then the representational image for the second step in the compound HRI 82 would include a holographic 3-dimensional image of the sub-frame 7, the first component 86, and the second component 90. The second component 90 would be included for the purposes of assembly and the first component 86 would be included for the purposes of QC/QA assessment. The operator 3 viewing the actual sub-frame 7 would be able to assess whether the assembly from the prior step was performed properly by comparing the 3-dimensional image of first component 86 to the actual first component 86. If they are substantially superimposed one with the other, then the prior assembly step has passed inspection, and if not then the sub-frame 7 may be sent for rework.

Alternatively, if each step of the manufacturing assembly line 1 incorporates a QC/QA inspection of the assembly performed at all prior steps, then the representational image for each step in the compound HRI 82 would include a holographic 3-dimensional image of the sub-frame 7, the component currently being assembled, and all components from all prior assembly steps. Thus, if assembly step 95 is the third assembly step of the manufacturing assembly line 1, the representational image contained in the compound HRI 82 for assembly step 95 would include a holographic 3-dimensional image of the sub-frame 7, component 86 and the components assembled during the two prior steps. The operator 3 viewing the actual sub-frame 7 would be able to assess whether the assembly from the prior step was performed properly by comparing the 3-dimensional image of component 86 to the actual component 86. If they are substantially superimposed one with the other, then the prior assembly step has passed inspection, and if not then the sub-frame 7 may be sent for rework.

This type of integrated QC/QA process may also be applied to the assembly process as described with respect to FIG. 1. For example, if step 5 was the fourth step of the manufacturing assembly line 1, the representational image contained in HRI 11 would include a 3-dimensional image of the sub-frame 7, component 9 and the components assembled during the three prior steps. The operator 3 viewing the actual sub-frame 7 would be able to assess whether the assembly from the prior step was performed properly by comparing the 3-dimensional image of component 9 to the actual component 9. If they are substantially superimposed one with the other, then the prior assembly step has passed inspection, and if not then the sub-frame 7 may be sent for rework.

Figure 8A:
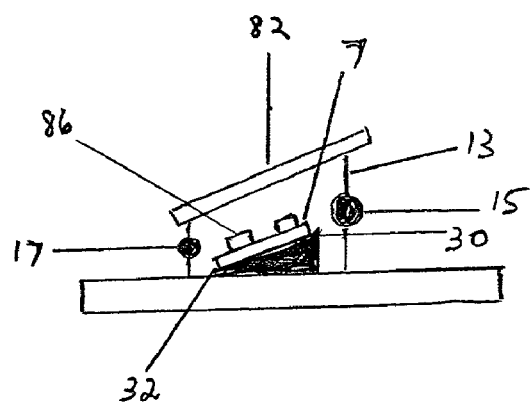
FIGS. 8(a) and 8(b) show positions for the sub-frame when a compound HRI is used according to an embodiment of the present invention.
Figure 8B:
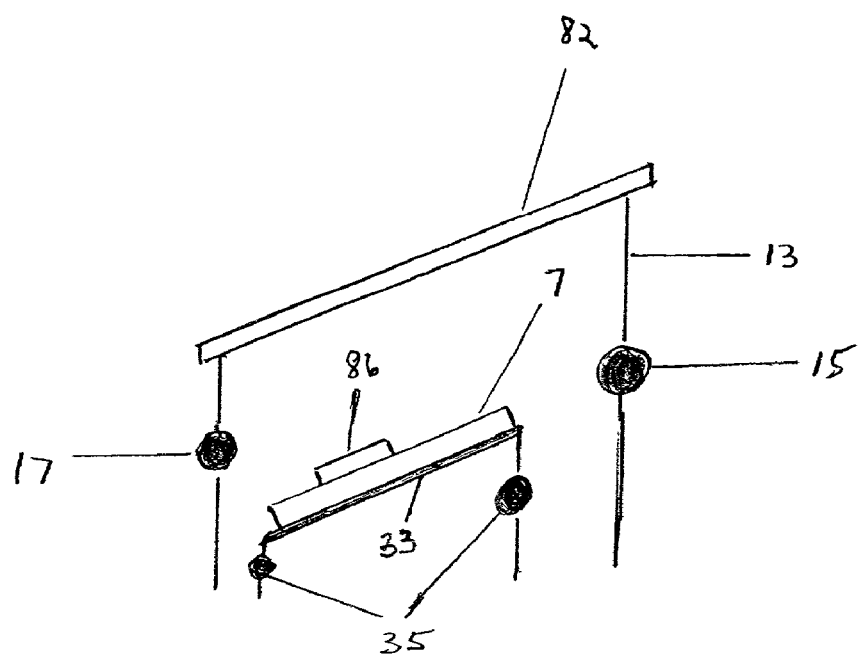

Referring now to FIGS. 8(*a*) and 8(*b*), there are shown positions for the sub-frame when a compound HRI is used according to an embodiment of the present invention. Alternatively, as shown in FIG. 8(*a*), the sub-frame 7 may be positioned such that side 30, which is located furthest from the operator 3, is raised with respect to side 32, which is located nearest the operator 3. Thus, the sub-frame 7 may be positioned on a plane parallel to the plane on which the compound HRI 82 is positioned. Alternatively, as shown in FIG. 8(*b*), the sub-frame 7 may be positioned in or on an adjustable device 33, whereby the position of the sub-frame 7 may be adjusted, for example, using one or more of positioning devices 35, relative to the compound HRI 82. When all of the steps of the manufacturing assembly line 1 are completed, the manufacturing assembly line 1 may be operated.

What is claimed is:

1. A method for modifying a manufactured object utilizing a representational image, comprising:
   positioning the manufactured object at a predetermined position relative to the representational image;
   illuminating the representational image;
   transmitting information from the representational image to an operator as a result of the illuminating; and
   modifying the manufactured object by the operator using the transmitted information.

2. The method of claim 1, wherein the transmitting is accomplished by superimposing the representational image with the manufactured object.

3. The method of claim 2, wherein the superimposing is accomplished using an holographic optical element.

4. The method of claim 2, wherein the superimposing includes projecting the representational image onto the manufactured object.

5. The method of claim 2, wherein the superimposing includes holographically displaying the representational image in relation to the manufactured object.

6. The method of claim 1, wherein the representational image is a two-dimensional image.

7. The method of claim 1, wherein the representational image is a three-dimensional image.

8. The method of claim 1, wherein the representational image is a holographic image.

9. The method of claim 1, wherein the modifying of the manufactured object includes performing an assembling step.

10. The method of claim 1, wherein the modifying of the manufactured object includes performing a painting step.

11. The method of claim 1, wherein the modifying of the manufactured object includes performing a decal application step.

12. The method of claim 1, wherein the modifying of the manufactured object includes performing a cutting step.

13. The method of claim 1, wherein the modifying of the manufactured object includes performing a wire harnessing operation.

14. The method of claim 1, wherein the manufactured object is positioned on a movable surface.

15. The method of claim 1, wherein the manufactured object is positioned at a distance from the representational image substantially equal to the focal distance of the representational image.

16. The method of claim 1, wherein the representational image is illuminated using white light.

17. The method of claim 1, wherein the representational image is illuminated using light of a predetermined wavelength.

18. The method of claim 1, wherein information is transmitted from the representational image to the object by projection.

19. The method of claim 1, wherein information is transmitted from the representational image to the object by reflection.

20. The method of claim 1, wherein information is transmitted from the representational image to a viewer by reflection.

21. The method of claim 1, wherein information is transmitted from the representational image to a viewer by transmission.

22. The method of claim 1, wherein the operator is a human.

23. The method of claim 1, wherein the operator is an automated system.

24. The method of claim 23, wherein the automated system is partially automated system.

25. The method of claim 23, wherein the automated system is a machine vision system.

26. A method for modifying an object utilizing a plurality of representational images, comprising:
   positioning the object at a predetermined position relative to a repository of a plurality of representational images;
   providing a first source of illumination for the repository of the plurality of representational images;
   illuminating the repository of to plurality of representational images using the first source of illumination;
   presenting a first representational image to an operator;
   performing a first modification of the object using the transmitted first representational image;
   providing a second source of illumination for the repository of the plurality of representational images;
   illuminating the repository of the plurality of representational images using the second source of illumination;
   presenting a second representational image to the operator; and
   performing a second modification of the object using the transmitted second representational image.

27. The method of claim 26, wherein the first source of illumination is a different wavelength than the second source of illumination.

28. The method of claim 26, wherein the first source of illumination is positioned at a different angle relative to the repository of the plurality of representational images than the second source of illumination.

29. The method of claim 26, wherein the first source of illumination is positioned at a different distance from the repository of the plurality of representational images than the second source of illumination.

30. The method of claim 26, wherein the plurality of representational images include a 2-dimensional image.

31. The method of claim 26, wherein the plurality of representational images include a 3-dimensional image.

32. The method of claim 26, wherein the plurality of representational images include a 2-dimensional image and a 3-dimensional image.

33. The method of claim 26, wherein the plurality of representational images include a holographically recorded image.

34. The method of claim 26, wherein the plurality of representational images include a compound hologram.

35. The method of claim 26, wherein the plurality of representational images include a plurality of images recorded holographically.

36. The method of claim 26, further comprising the step of moving the object to a different predetermined position after illuminating the repository of the plurality of representational images using the first source of illumination.

37. The method of claim 26, further comprising the step of moving the repository of the plurality of representational images to a different predetermined position after illuminating the repository of the plurality of representational images using the first source of illumination.

38. The method of claim 26, wherein the first source and second source of illumination are the same source of illumination.

39. The method of claim 26, wherein the operator is a human.

40. The method of claim 26, wherein the operator is an automated system.

41. The method of claim 40, wherein the automated system is partially automated system.

42. The method of claim 40, wherein the automated system is a machine vision system.

43. A method for modifying a manufactured object utilizing a representational image, comprising:
   positioning the manufactured object at a predetermined position relative to a repository of the representational image;
   illuminating the repository of the representational image;
   presenting the representational image to an operator as a result of the illuminating; and
   modifying the manufactured object by the operator using the representational image.

44. The method of claim 40, wherein the operator is a human.

45. The method of claim 40, wherein the operator is an automated system.

46. The method of claim 45, wherein the automated system is partially automated system.

47. The method of claim 45, wherein the automated system is a machine vision system.

48. A method for modifying a manufactured object utilizing a representational image, comprising:
   positioning the manufactured object at a predetermined position relative to the representational image that is substantially equal to the focal distance of the representational image;
   illuminating the representational image;
   transmitting information from the representational image to an operator as a result of the illuminating; and
   modifying the manufactured object by the operator using the transmitted information.

49. The method of claim 48, wherein the operator is a human.

50. The method of claim 48, wherein the operator is an automated system.

51. The method of claim 50, wherein the automated system is partially automated system.

52. The method of claim 50, wherein the automated system is a machine vision system.

53. A method for modifying a manufactured object utilizing a representational image, comprising:

positioning the manufactured object at a predetermined position relative to the representational image;

illuminating the representational image;

releasing information from the representational image as a result of the illuminating;

identifying at least one difference between the manufactured object and the representational image using the released information; and modifying the manufactured object using the released information, wherein the modifying is accomplished by an operator, a partially automated system or a fully automated system.

54. The method of claim 53, further comprising the step of superimposing the released information with the manufactured object.

55. The method of claim 54, wherein the superimposing includes projecting.

56. The method of claim 54, wherein the superimposing includes holographically displaying.

57. The method of claim 53, wherein the information released from the representational image is processed by an automated detection device.

58. The method of claim 57, wherein the automated detection system is a machine vision system.

59. A system for modifying a manufactured object utilizing a representational image, comprising:

a positioning means for positioning the manufactured object at a predetermined position relative to the representational image;

an illuminating means for illuminating the representational image, whereby information is transmitted from the representational image to an operator as a result of the illuminating; and a modifying means for modifying the manufactured object by the operator based on the transmitted information.

* * * * *